(12) United States Patent
Horiuchi et al.

(10) Patent No.: US 11,437,263 B2
(45) Date of Patent: Sep. 6, 2022

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Michio Horiuchi, Nagano (JP); Masaya Tsuno, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 316 days.

(21) Appl. No.: 16/903,742

(22) Filed: Jun. 17, 2020

(65) Prior Publication Data

US 2020/0402829 A1    Dec. 24, 2020

(30) Foreign Application Priority Data

Jun. 20, 2019  (JP) .............................. JP2019-114452
Feb. 7, 2020   (JP) .............................. JP2020-019459

(51) Int. Cl.
   *H01L 21/683*  (2006.01)
   *H01J 37/32*   (2006.01)
   *H01L 21/67*   (2006.01)

(52) U.S. Cl.
   CPC .... *H01L 21/6833* (2013.01); *H01J 37/32082* (2013.01); *H01J 37/32715* (2013.01); *H01J 2237/3345* (2013.01); *H01L 21/67069* (2013.01)

(58) Field of Classification Search
   CPC ........... H01L 21/6833; H01L 21/67069; H01L 21/68757; H01J 37/32082; H01J 37/32715; H01J 2237/3345; B23Q 3/15; C23C 16/4586; H02N 13/00
   See application file for complete search history.

(56) References Cited

U.S. PATENT DOCUMENTS

| 2008/0258082 | A1* | 10/2008 | Okumura ........ | H01J 37/32642 250/492.3 |
| 2020/0203205 | A1* | 6/2020 | Lee ................ | H01L 21/68785 |
| 2020/0303229 | A1* | 9/2020 | Ozaki ............. | H01L 21/6875 |

FOREIGN PATENT DOCUMENTS

JP      2004-260142      9/2004

* cited by examiner

*Primary Examiner* — Renan Luque
(74) *Attorney, Agent, or Firm* — Rankin, Hill & Clark LLP

(57) ABSTRACT

An electrostatic chuck includes at least one conductor layer; an electrostatic electrode; and a base body in which the electrostatic electrode is embedded, the base body having a first dielectric layer on which the electrostatic electrode is mounted, the base body having a second dielectric layer stacked on the first dielectric layer with covering the electrostatic electrode. The conductor layer is formed on a surface of the first dielectric layer opposite to a surface on which the electrostatic electrode is mounted. The second dielectric layer has a first surface facing the first dielectric layer and a second surface opposite to the first surface, and the second surface is a placement surface on which a suction target is placed. A relative permittivity of the first dielectric layer is lower than a relative permittivity of the second dielectric layer.

7 Claims, 7 Drawing Sheets

ELECTROSTATIC CHUCK AND SUBSTRATE FIXING DEVICE

CROSS-REFERENCE TO RELATED APPLICATIONS

This application is based upon and claims the benefit of priorities from prior Japanese patent application No, 2019-114452, filed on Jun. 20, 2019 and prior Japanese patent application No. 2020-019459, filed on Feb. 7, 2020, the entire contents of which are incorporated herein by reference.

TECHNICAL FIELD

The present disclosure relates to an electrostatic chuck and a substrate fixing device.

BACKGROUND ART

In the related art, a film forming device and a plasma etching device that are used when manufacturing a semiconductor device each have a stage for holding a wafer in a vacuum treatment chamber with accuracy. As the stage, for example, suggested is a substrate fixing device configured to suck and hold a wafer by an electrostatic chuck mounted on a base plate.

Upon de-chucking, a suction force may remain in the electrostatic chuck, so that countermeasures against the residual suction force are considered. As an example, there is a substrate fixing device including a means for removing moisture and capable of preventing moisture from being attached to a contact surface between the electrostatic chuck and a suction target. The substrate fixing device prevents situations where moisture is attached to the contact surface between the electrostatic chuck and the suction target, so that a relative permittivity is increased to increase a residual suction force, thereby considerably deteriorating separability of the suction target from the electrostatic chuck (for example, refer to PTL 1).

CITATION LIST

Patent Document

[PTL 1] JP-A-2004-260142

However, since the moisture is not the only factor that increases the residual suction force, there is a need for new measures capable of reducing the residual suction force.

SUMMARY OF INVENTION

Aspect of non-limiting embodiments of the present disclosure is to provide an electrostatic chuck and a substrate fixing device capable of reducing a residual suction force.

An electrostatic chuck according to non-limiting embodiment of the present disclosure comprises:
  at least one conductor layer;
  an electrostatic electrode; and
  a base body in which the electrostatic electrode is embedded, the base body having a first dielectric layer on which the electrostatic electrode is mounted, the base body having a second dielectric layer stacked on the first dielectric layer with covering the electrostatic electrode,
  wherein the conductor layer is formed on a surface of the first dielectric layer opposite to a surface on which the electrostatic electrode is mounted,
  wherein the second dielectric layer has a first surface facing the first dielectric layer and a second surface opposite to the first surface, and the second surface is a placement surface on which a suction target is placed, and wherein a relative permittivity of the first dielectric layer is lower than a relative permittivity of the second dielectric layer.

According to the present disclosure, it is possible to provide the electrostatic chuck and a substrate fixing device capable of reducing the residual suction force.

DESCRIPTION OF EMBODIMENTS

Hereinbelow, embodiments of the present disclosure will be described with reference to the drawings. In the respective drawings, the same constituent parts are denoted with the same reference signs, and the overlapping descriptions may be omitted.

First Embodiment

Figure 1:
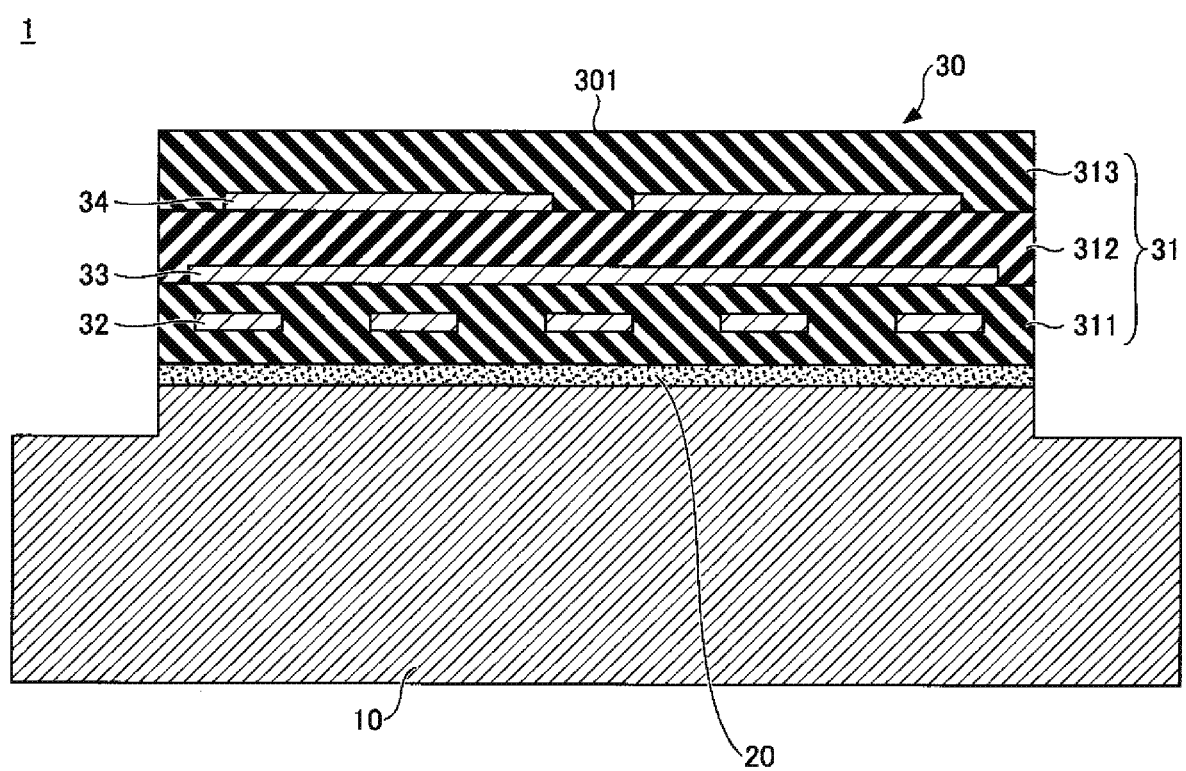
FIG. 1 is a sectional view exemplifying a substrate fixing device in accordance with a first embodiment.

FIG. 1 is a sectional view exemplifying a substrate fixing device in accordance with a first embodiment. Referring to FIG. 1, a substrate fixing device 1 includes, as main constituent elements, a base plate 10, an adhesion layer 20, and an electrostatic chuck 30. The substrate fixing device 1 is a device configured to suck and hold a substrate (a wafer and the like) that is a suction target by the electrostatic chuck 30 mounted on one surface of the base plate 10.

The base plate 10 is a member for mounting the electrostatic chuck 30. A thickness of the base plate 10 is, for example, about 20 to 50 mm. The base plate 10 is formed of aluminum, for example.

In the base plate 10, a water channel may be provided. In this case, the water channel is connected to a cooling water control device provided outside of the substrate fixing device 1, and the cooling water control device is configured to introduce and discharge cooling water into and from the water channel. The cooling water is circulated in the water channel by the cooling water control device, so that the base plate 10 is cooled. As a result, the wafer sucked on the electrostatic chuck 30 can be cooled. The base plate 10 may be provided with a gas channel for introducing an inert gas for cooling the wafer sucked on the electrostatic chuck 30, in addition to the water channel.

The electrostatic chuck 30 is mounted on one surface of the base plate 10 via the adhesion layer 20. As the adhesion layer 20, for example, a silicon-based adhesive may be used. A thickness of the adhesion layer 20 is, for example, about 0.5 to 2 mm. A thermal conductivity of the adhesion layer 20 is preferably equal to or greater than 2 W/mK. The adhesion layer 20 may be formed by one layer but is preferably formed to have a bilayer structure where an adhesive having high thermal conductivity and an adhesive having low elastic modulus are combined. Thereby, it is possible to achieve an effect of reducing stress that is caused due to a difference between coefficients of thermal expansion of the ceramic electrostatic chuck 30 and the aluminum base plate 10.

The electrostatic chuck 30 has a base body 31, a heat generating body 32, an RF electrode 33, and an electrostatic electrode 34. The base body 31 has a dielectric layer 311, a dielectric layer 312, and a dielectric layer 313.

The electrostatic chuck 30 is configured to mount a suction target on the base body 31 having the electrostatic electrode 34 embedded therein and to suck and hold the suction target by generating a Coulomb force between the electrostatic electrode 34 and the suction target. The electrostatic chuck 30 has a placement surface 301 on which the substrate (a wafer and the like), which is the suction target, is sucked and held.

The dielectric layer 311 is bonded to the base plate 10 via the adhesion layer 20. The dielectric layer 311 is formed of ceramic in which alumina is a main component, for example. As used herein, the main component is a component that accounts for 90 weight % or more of components included in a target part. A thickness of the dielectric layer 311 is, for example, about 1100 to 3400 μm.

In the dielectric layer 311, the heat generating body 32 is embedded. The heat generating body 32 is electrically connected to a control circuit provided outside of the substrate fixing device 1 by a wiring (not shown), and is configured to generate heat as a voltage is applied thereto from the control circuit, thereby heating the placement surface 301 of the electrostatic chuck 30 to a predetermined temperature. The heat generating body 32 can heat the placement surface 301 of the electrostatic chuck 30 to about 60° C. to 300° C., for example. For the heat generating body 32, for example, copper (Cu), tungsten (W), nickel (Ni), molybdenum (Mo) and the like may be used. Copper and nickel are used when the dielectric layer of an organic material is used.

The RF electrode 33 is arranged in a region except an outer periphery part of an upper surface of the dielectric layer 311. The RF electrode 33 is provided so as to improve anisotropy and efficiency of plasma etching when the substrate fixing device 1 is used for the plasma etching, and is supplied with radio-frequency power for plasma control. The supply of the radio-frequency power by the RF electrode 33 is used so as to efficiently attract plasma into holes when forming holes having a high aspect ratio by the plasma, for example. The RF electrode 33 is preferably arranged in a substantially solid shape so as to uniformly attract the plasma. For the RF electrode 33, for example, tungsten, molybdenum and the like may be used.

The dielectric layer 312 is stacked on the dielectric layer 311 while covering the RF electrode 33. The dielectric layer 312 is formed of ceramic where mullite is a main component, for example. A thickness of the dielectric layer 312 is, for example, about 500 to 1100 μm. In the meantime, the dielectric layer 312 is a representative example of the first dielectric layer of the present disclosure.

The electrostatic electrode 34 is an electrode arranged on an upper surface of the dielectric layer 312. The electrostatic electrode 34 is connected to a power supply provided outside of the substrate fixing device 1 by a wiring (not shown), and is configured to generate a suction force (Coulomb force) by static electricity between the electrostatic electrode and the suction target as a predetermined voltage is applied thereto from the power supply. Thereby, the wafer can be sucked and held on the placement surface 301 of the electrostatic chuck 30. The electrostatic electrode 34 may have a monopolar shape or a bipolar shape. For the electrostatic electrode 34, for example, tungsten, molybdenum and the like may be used.

The dielectric layer 313 is stacked on the dielectric layer 312 with covering the electrostatic electrode 34. A surface of the dielectric layer 313 opposite to the dielectric layer 312-side is the placement surface 301 on which the suction target is placed. The dielectric layer 313 is formed of ceramic where alumina is a main component, for example. A thickness of the dielectric layer 313 is, for example, about 300 to 700 μm. In the meantime, the dielectric layer 313 is a representative example of the second dielectric layer of the present disclosure.

In the electrostatic chuck 30, the relative permittivity of the dielectric layer 312 is lower than the relative permittivity of the dielectric layer 313. When the dielectric layer 313 has alumina as a main component, the relative permittivity (1 MHz) is about 9 to 10. Also, when the dielectric layer 312 has mullite as a main component, the relative permittivity (1 MHz) is about 7. That is, the relative permittivity of the dielectric layer 312 is lower than the relative permittivity of the dielectric layer 313 by about 20%.

The suction and holding force between the electrostatic electrode 34 and the suction target is greater as the voltage applied to the electrostatic electrode 34 is higher, and is also greater as the relative permittivity of the dielectric layer 313 is larger. Since there is a limit to increasing the voltage to be applied to the electrostatic electrode 34, it can be said that the relative permittivity of the dielectric layer 313 is preferably larger, from a standpoint of the suction and holding force. Therefore, among the ceramics, the dielectric layer 313 has preferably alumina having high relative permittivity as a main component, so as to secure the predetermined suction and holding force or higher.

On the other hand, among the ceramics, the dielectric layer 312 has preferably a material having low relative permittivity, as a main component. The reason is described in the below.

As described above, a suction force may remain in the electrostatic chuck upon de-chucking. Particularly, in the electrostatic chuck that is used for the plasma etching, the residual suction force tends to increase, as etching conditions such as a treatment temperature become stricter. The increase in residual suction force not only leads to a decrease in throughput of a treatment process but also may cause a demounting problem, resulting in damage to the wafer. Therefore, the reduction in residual suction force is strongly needed.

As main factors of the residual suction force, it may be exemplified that a parasitic capacity occurring between an electrostatic electrode and a conductor layer below the electrostatic electrode becomes residual charges. As the parasitic capacity between the conductor layer and the electrostatic electrode increases, the residual suction force increases. Therefore, it is necessary to take measures to reduce the parasitic capacity as much as possible.

In the substrate fixing device 1, a conductor layer below the electrostatic electrode 34 is the RF electrode 33. When the substrate fixing device 1 is used for the plasma etching, it is necessary to bring the RF electrode 33 as close to the electrostatic electrode 34 as possible so as to improve anisotropy and efficiency of the plasma etching.

However, when the RF electrode 33 is brought close to the electrostatic electrode 34, the parasitic capacity between the RF electrode 33 and the electrostatic electrode 34 increases. Since the parasitic capacity between the RF electrode 33 and the electrostatic electrode 34 is proportional to the relative permittivity of the dielectric layer 312, the relative permittivity of the dielectric layer 312 is preferably low.

Therefore, in the substrate fixing device 1, the relative permittivity of the dielectric layer 312 of the electrostatic chuck 30 is made lower than the relative permittivity of the dielectric layer 313. Thereby, it is possible to suppress the increase in parasitic capacity and to reduce the residual suction force.

In the above, the case where the dielectric layer 313 has alumina as a main component and the dielectric layer 312 has mullite as a main component has been exemplified. However, the present disclosure is not limited thereto. For example, when the dielectric layer 313 has alumina as a main component, the dielectric layer 312 may have any one of mullite (relative permittivity: about 7), forsterite (relative permittivity: about 6), steatite (relative permittivity: about 67) and cordierite (relative permittivity: about 5), as a main component. By selecting the materials, the relative permittivity of the dielectric layer 312 can be set lower than the relative permittivity of the dielectric layer 313 by about 20 to 40%.

In the above example, the case where the dielectric layer 311 has alumina as a main component has been described. However, the present disclosure is not limited thereto. For example, the dielectric layer 311 may have any one of alumina, mullite, forsterite, steatite and cordierite, as a main component.

A dissipation rate of charges accumulated between the electrostatic electrode and the underlying conductor layer is affected by the relative permittivity of the dielectric layer between the electrostatic electrode and the conductor layer. That is, the lower the relative permittivity is, the faster the charge dissipation rate is. As a result, even when one or more conductor layers are formed in the dielectric layer 312 for high functionalization of the electrostatic chuck 30, the effect thereof on the residual suction force can be reduced.

In order to check the above effects, as an example, the charge dissipation rate was Obtained by a simulation where the relative permittivity of the dielectric layer below the electrostatic electrode was made lower than the relative permittivity of the dielectric layer above the electrostatic electrode by 30%. A result thereof is shown in FIG. 2.

Figure 2:
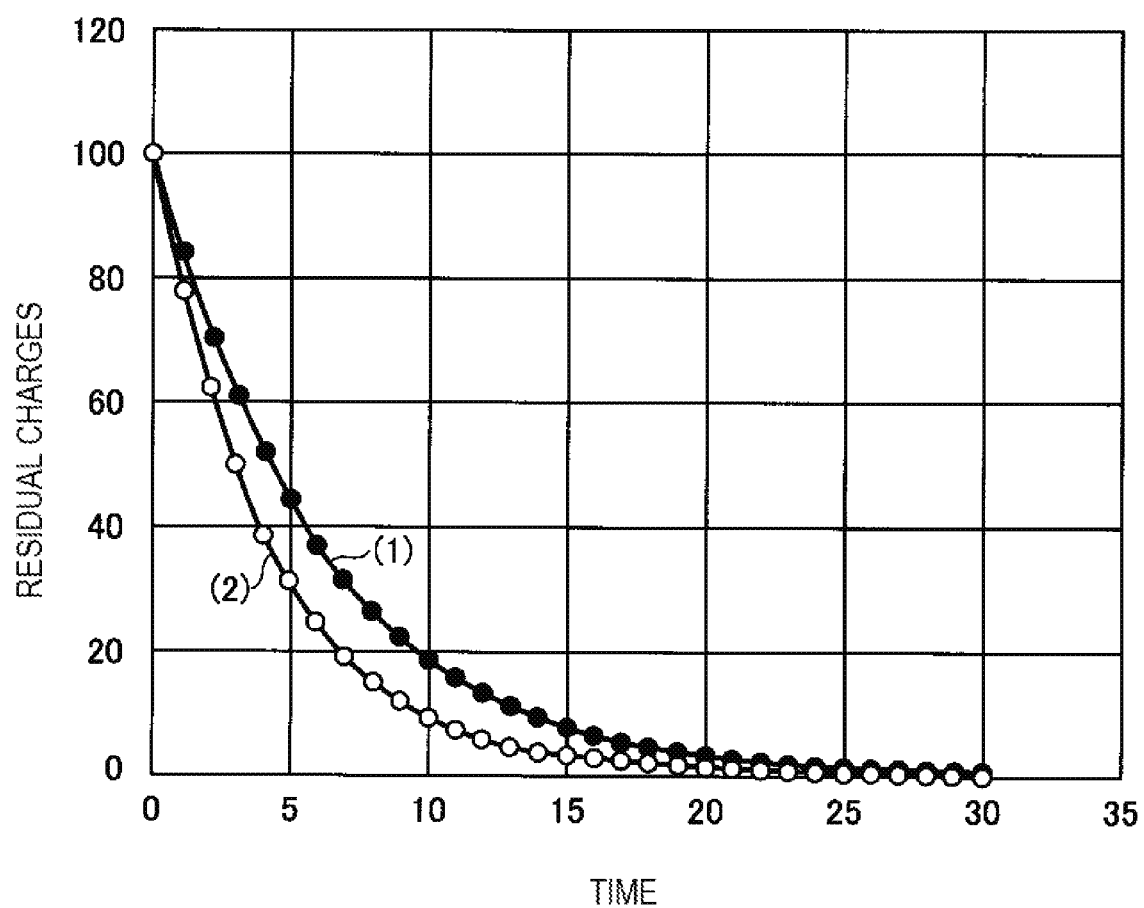
FIG. 2 exemplifies a simulation result of a relation between time and residual charges.

In FIG. 2, a reference sign (1) indicates a characteristic obtained when the relative permittivity of the dielectric layer below the electrostatic electrode was made to be the same as the relative permittivity of the dielectric layer above the electrostatic electrode. A reference sign (2) indicates a characteristic obtained when the relative permittivity of the dielectric layer below the electrostatic electrode was made lower than the relative permittivity of the dielectric layer above the electrostatic electrode by 30%. As can be seen from FIG. 2, in the case of (2), the charge dissipation rate is significantly faster, as compared to the case of (1).

In the meantime, from a standpoint of speeding up the charge dissipation rate, the highest effect can be expected when the dielectric layer below the electrostatic electrode is configured using cordierite having the lowest relative permittivity of the above-exemplified materials. However, since the dielectric layer below the electrostatic electrode is co-calcined with the dielectric layer above the electrostatic electrode, a normal constituent body may not be obtained due to interlayer movement and interaction of constituent components, depending on a composition and a calcination condition of alumina that is used for the upper dielectric layer. Therefore, when alumina is used for the upper dielectric layer, mullite in which the above-described problems are most difficult to occur in the co-calcination process is preferably used.

In the meantime, from a standpoint of stability of the base body after forming a sintered body, it is necessary to consider stress that is caused due to a difference between coefficients of thermal expansion of the dielectric layers. The coefficients of thermal expansion of alumina, mullite, forsterite, steatite and cordierite are respectively about 7 ppm/° C., about 5 ppm/° C., about 10 ppm/° C., about 8 ppm/° C. and about 2 ppm/° C. Therefore, it is necessary to note that there is generation of stress with an increase in area of an interface.

Also, when viewed as a function after being configured as an electrostatic chuck, it is also necessary to consider the thermal conductivity of each material. In general, in an electrostatic chuck that is used for a semiconductor manufacturing apparatus, it is required to keep a wafer uniformly at a desired temperature while circulating a coolant in a base plate to remove heat generated during a plasma treatment from the wafer to the base plate via the base body.

The thermal conductivity of alumina, mullite, forsterite, steatite and cordierite is affected by purity and the like but is about 20 W/mK, about 7 W/mK, about 5 W/mK, about 2 W/mK, and about 4 W/mK. Therefore, it is necessary to consider that the thermal conductivity of the other ceramic materials is lower than the thermal conductivity of alumina, when designing a structure.

That is, after sufficiently considering the problem in the co-calcination process, the coefficient of thermal expansion and the thermal conductivity, it is necessary to select a material of the dielectric layer below the electrostatic electrode so as to satisfy requirements.

In order to manufacture the substrate fixing device 1, for example, alumina and a sintering aid component are mixed with an organic solvent (alcohol-based, ester-based, ketone-based, aromatic-based or mixture thereof), a plasticizer (such as methyl-octyl esters of phthalic acid and adipic acid, and the like), an organic binder (polyvinyl alcohol, polyvinyl butyral, acrylic polymer and the like), a dispersing agent, and the like, and which is then formed into a predetermined thickness to obtain a green sheet for forming the dielectric layer 313.

Also, for example, mullite and a sintering aid component are mixed with the similar organic solvent, plasticizer, organic binder, dispersing agent and the like, which is then formed into a predetermined thickness to obtain a green sheet for forming the dielectric layer 312.

Also, for example, alumina and a sintering aid component are mixed with the similar organic solvent, plasticizer, organic binder, dispersing agent and the like, which is then formed into a predetermined thickness to obtain a green sheet for forming the dielectric layer 311.

Then, the heat generating body 32 having a predetermined shape is printed and formed on the specific green sheet by using a paste of which a main component is tungsten, molybdenum or the like. Also, the RF electrode 33 having a predetermined shape is printed and formed on the specific green sheet by using a paste of which a main component is refractory metal (tungsten, molybdenum or the like). Also, the electrostatic electrode 34 having a predetermined shape is printed and formed on the specific green sheet by using a paste of which a main component is refractory metal (tungsten, molybdenum or the like). Also, the specific green sheets are subjected to processing such as through-holes.

Then, the green sheets are stacked, heated and pressed to obtain an integrated body. After performing necessary processing such as through-holes on the integrated body, external shape processing is performed, and degreasing and co-calcination are performed in an atmosphere where the electrode material is not oxidized, so that the electrostatic chuck 30 is obtained. After performing necessary additional processing on the electrostatic chuck 30, the electrostatic chuck is bonded and integrated with the base plate 10 via a binder material having predetermined elastic modulus and thermal conductivity, as the adhesion layer 20. The surface of the electrostatic chuck 30 is machined into a desired state, various components are mounted thereon and electrical connection is performed, so that the substrate fixing device 1 is completed.

Second Embodiment

In a second embodiment, an example is described in which the dielectric layers above and below the electrostatic electrode are formed using the same material as a main component and the relative permittivity of both the dielectric layers is changed. In the second embodiment, the descriptions of the same constituent parts as the first embodiment may be omitted.

Figure 3:
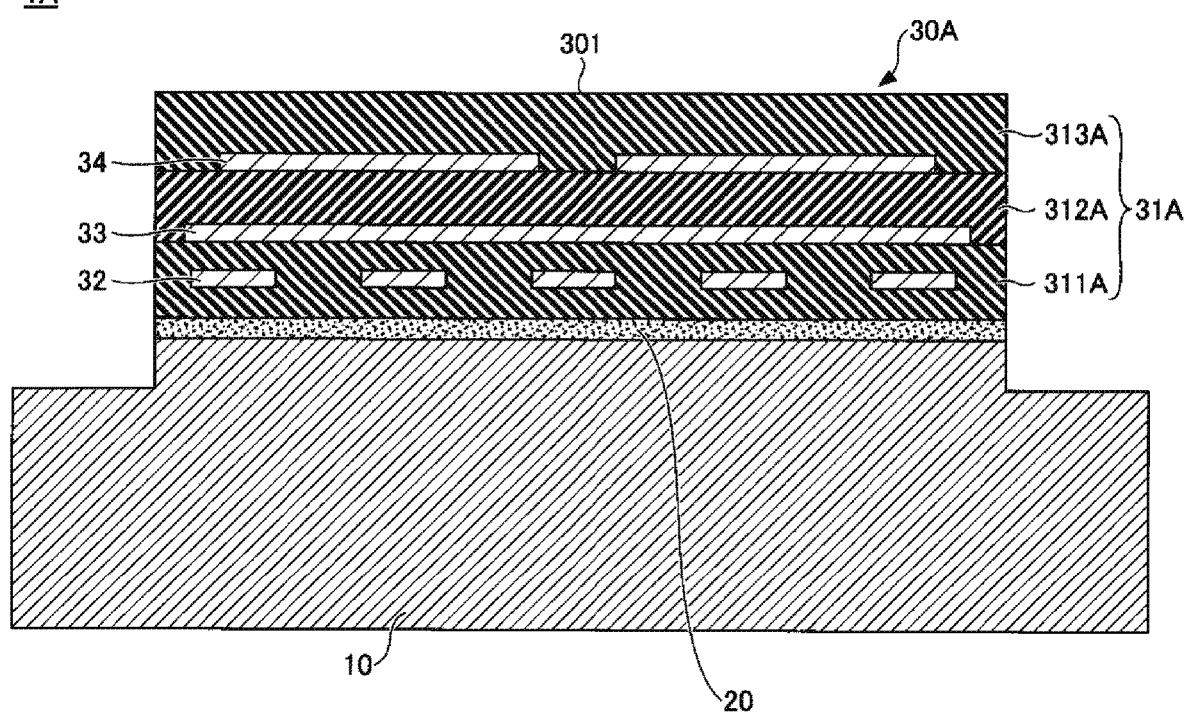
FIG. 3 is a sectional view exemplifying a substrate fixing device in accordance with a second embodiment.

FIG. 3 is a sectional view exemplifying a substrate fixing device in accordance with a second embodiment. Referring to FIG. 3, a substrate fixing device 1A is different from the substrate fixing device 1 (refer to FIG. 1), in that the electrostatic chuck 30 is replaced with an electrostatic chuck 30A.

The electrostatic chuck 30A has a base body 31A, a heat generating body 32, an RF electrode 33, and an electrostatic electrode 34. The base body 31A has a dielectric layer 311A, a dielectric layer 312A, and a dielectric layer 313A.

The dielectric layer 311A is made of ceramic where alumina is a main component, for example. The dielectric layer 312A is made of ceramic where the same material as the dielectric layer 311A is a main component but the porosity is different from the dielectric layer 311A. The dielectric layer 313A is made of ceramic where the same material as the dielectric layer 311A is a main component but the porosity is different from the dielectric layer 311A.

Specifically, the porosity of the dielectric layer 312A is greater than the porosity of the dielectric layer 313A. Also, the porosity of the dielectric layer 311A is greater than the porosity of the dielectric layer 313A and is the same as the porosity of the dielectric layer 312A. However, the porosity of the dielectric layer 311A may be the same as the porosity of the dielectric layer 313A.

In this way, the porosity of the dielectric layer 312A is made greater than the porosity of the dielectric layer 313A, so that the relative permittivity of the dielectric layer 312A can be made lower than the relative permittivity of the dielectric layer 313A. This is described in the below.

Figure 4:
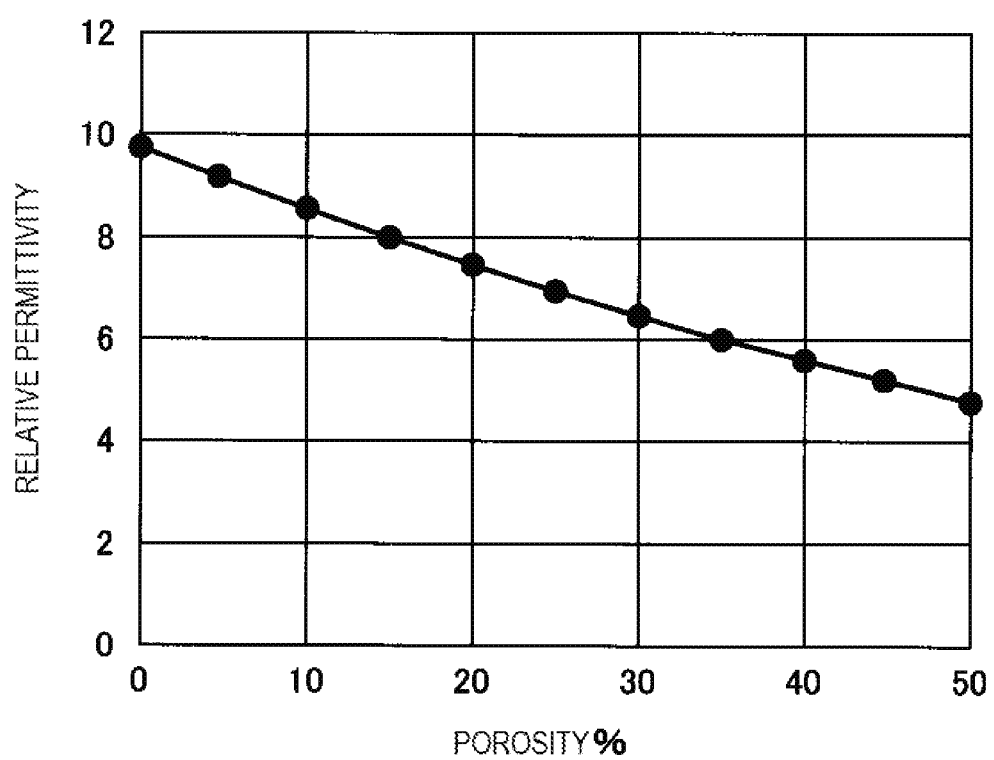
FIG. 4 exemplifies a simulation result of a relation between porosity and relative permittivity.

FIG. 4 exemplifies a simulation result of a relation between the porosity and the relative permittivity. In FIG. 4, in a composition where alumina having relative permittivity of 9.8 (the porosity is about 0%) is based, the relative permittivity when the porosity is changed is obtained by a simulation. As shown in FIG. 4, as the porosity increases, the relative permittivity decreases, From FIG. 4, at the porosity of 25%, for example, the relative permittivity is about 7, which is an equivalent level to mullite. That is, when the porosity is set to 25% in alumina having relative permittivity of 9.8, the relative permittivity can be reduced (about 30%) to the relative permittivity that is an equivalent level to mullite.

The ceramic materials with different porosity have no problems of interlayer movement of components during the co-calcination and internal stress caused due to a difference in coefficient of thermal expansion of the sintered body, because there is no difference in the inorganic component composition of the green sheet and the crystallographic state (XRD) of the sintered body.

Figure 5:
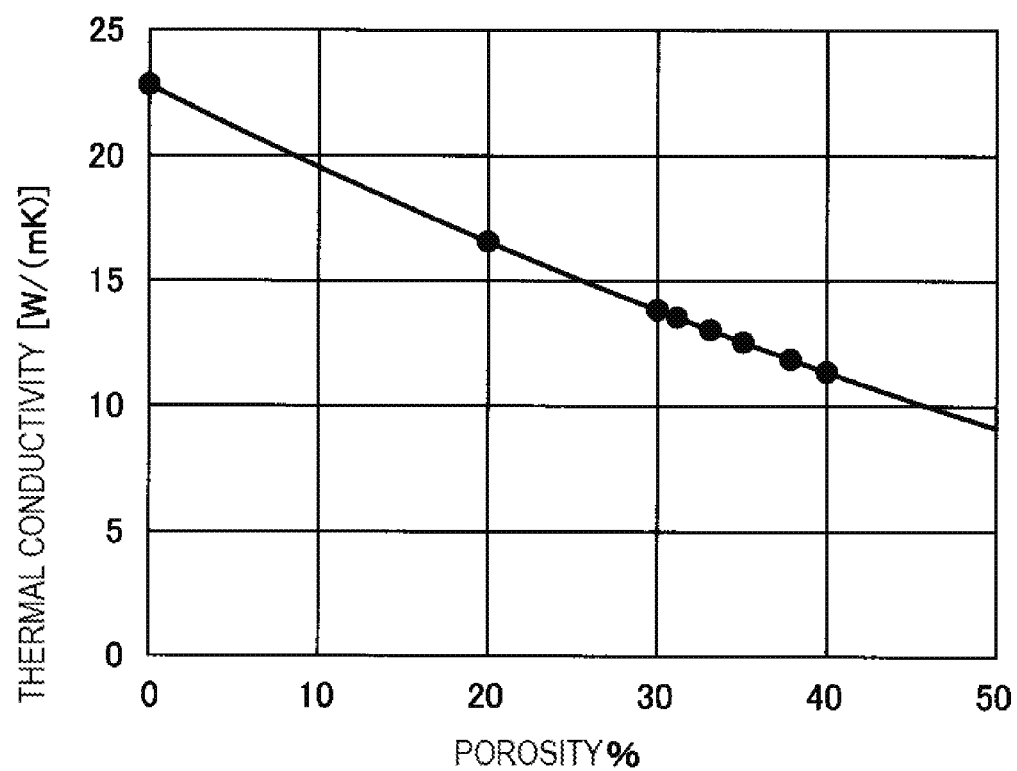
FIG. 5 exemplifies a simulation result of a relation between porosity and thermal conductivity.

FIG. 5 exemplifies a simulation result of a relation between the porosity and the thermal conductivity. In FIG. 5, in a composition where alumina having relative permittivity of 9.8 (the porosity is about 0%) is based, the thermal conductivity when the porosity is changed is obtained by a simulation. As shown in FIG. 5, as the porosity increases, the thermal conductivity decreases. However, from FIG. 5, for example, at the porosity of 25% at which the relative permittivity can be reduced (about 30%) to the relative permittivity that is an equivalent level to mullite, the thermal conductivity is about 15 W/mK, which is not problematic because it is higher than the thermal conductivity (about 7 W/mK) of mullite.

In the meantime, the sintered body layer with increased porosity may have a problem of deterioration in withstand voltage, depending on use conditions. Also, when sizes of pores are large, abnormal discharge may be caused, depending on use conditions. Therefore, in order to prevent the abnormal discharge, the sizes of pores are preferably formed as small and uniform as possible.

Also, although not shown, the electrostatic chuck 30A is formed with a flow path of a gas such as helium, in addition to an electrical connection structure and a lift pinhole, in many cases. In order to prevent gas leakage, it is necessary to reduce the porosity by closed pores (a pore structure with no continuous connection).

The extent to which the porosity is reduced is appropriately determined, considering the lowering in thermal conductivity and the deterioration in withstand voltage. As a favorable example, a configuration may be exemplified in which the dielectric layer 313A has, as a main component, alumina with a relative density of 92% or higher and the dielectric layer 312A has, as a main component, alumina with a relative density 50% or higher and less than 90%. The reason that the configuration is favorable is described in the below.

Although the relative density of the dielectric layer 313A is preferably high, it is necessary to increase purity of alumina that is a main component for that purpose. This is to make it easier for pores to escape (to prevent confinement by a liquid phase) by reducing the liquid phase component that is generated during the calcination.

In the meantime, when the liquid phase component is reduced as a result of the increase in purity of alumina, it is difficult to form an anchor (a connection fixing part) with the conductor layer (the RF electrode 33 or the electrostatic electrode 34), so that adhesion strength of the conductor layer is likely to decrease. Considering the conductor adhesion strength, a certain amount of the liquid phase component is required. Actually, the porosity with the relative density of 95% to 98% is obtained. Particularly, when the conductor adhesion strength is required, the liquid phase component is increased or the composition is adjusted, so that the obtained relative density becomes about 92%, in some cases. When the relative density is 98% or greater, the liquid phase component is significantly low or is not substantially generated, so that a special best composition is required. That is, considering the easiness with which the pores are escaped and the conductor adhesion strength, it is preferable that the dielectric layer 313A has, as a main component, alumina with the relative density 92% or greater.

The relative density of the dielectric layer 312A is preferably low because it is possible to more easily reduce the parasitic capacity. Also, the relative density is preferably about 50% because the pores do not form a continuous phase. However, the magnitude of the parasitic capacity also depends on design factors such as a distance between the RF electrode 33 and the electrostatic electrode 34 and areas of the electrodes. Also, it is necessary to consider the thermal conductive property. For this reason, it is preferably to set the relative density of the dielectric layer 312A to any value within a range of 50% or greater and less than 90%, in conformity to the overall required characteristics.

In order to change the porosity, when manufacturing the electrostatic chuck 30A, for example, alumina and a sintering aid component may be mixed with the organic solvent, plasticizer, organic binder, dispersing agent, burn-off particles, and the like, which are similar to the above, and may be formed into a predetermined thickness to obtain a green sheet for forming the dielectric layer 312. The other processes are the same as the first embodiment.

As used herein, the burn-off particles are particles that are burned and vanished (at lower temperatures that the calcination temperature of alumina) during the calcination process of alumina. The burn-off particles are preferably substantially spherical particles of which an average particle size is larger than an average particle size of alumina particles. If the average particle size of the burn-off particles is smaller than the average particle size of alumina particles, the burn-off particles may be positioned in gaps between the adjacent alumina particles. In this case, the burn-off particles cannot contribute to improvement on the porosity.

A volume ratio of the burn-off particles to the alumina particles may be determined as appropriate, in accordance with a desired porosity. When using alumina particles, carbon particles or PMMA particles (polymethyl methacrylate particles) may be used as the burn-off particles, for example.

Thereafter, in the similar process to the manufacturing process of the first embodiment, during the co-calcination, the burn-off particles are vanished, so that pores are formed.

As described above, when the dielectric layer 312A and the dielectric layer 313A are formed of the different materials, there are problems that a normal constituent body is not obtained due to interlayer movement and interaction of the ceramic constituent components during the calcination process and stress is caused due to the difference of coefficients of thermal expansion between the respective dielectric layers. Therefore, when the dielectric layer 312A and the dielectric layer 313A are formed using the same material as a main component and the porosity of the dielectric layer 312A is made greater than the porosity of the dielectric layer 313A to make the relative permittivity of the dielectric layer 312A lower than the relative permittivity of the dielectric layer 313A, the above problems can be solved.

In the meantime, whether the dielectric layer 312A and the dielectric layer 313A are formed using the different materials as a main component or the same material as a main component is determined, considering a functional design structure of the overall electrostatic chuck and use environments (treatment conditions of the plasma etching and the like) for optimization.

In the below, examples of the present disclosure. However, it should be noted that the present disclosure is not limited to the examples.

EXAMPLES

A polyvinyl butyral binder, a phthalic acid-based plasticizer, and an alcohol-based solvent were added to a mixture of inorganic oxide powders consisting of alumina ceramic of 94 wt % and the balance of silicon oxide, magnesium oxide, and calcium oxide (added as calcium carbonate). Then, the obtained mixture was pulverized and mixed to prepare a slurry by a ball mill method, which slurry was then subjected to vacuum defoaming and viscosity adjustment and was then formed into two first green sheets having a thickness of about 0.5 mm by a doctor blade method.

A second green sheet having a thickness of about 0.5 mm was prepared in the same manner as described above, except that a predetermined amount of a graphite-based pore-forming agent (particle diameter: about 10 μm) was mixed with the same composition. Then, the first green sheet/the second green sheet/the first green sheet were stacked in corresponding order, which was then heated and pressed to obtain a plate-shaped integrated body.

Figure 6:
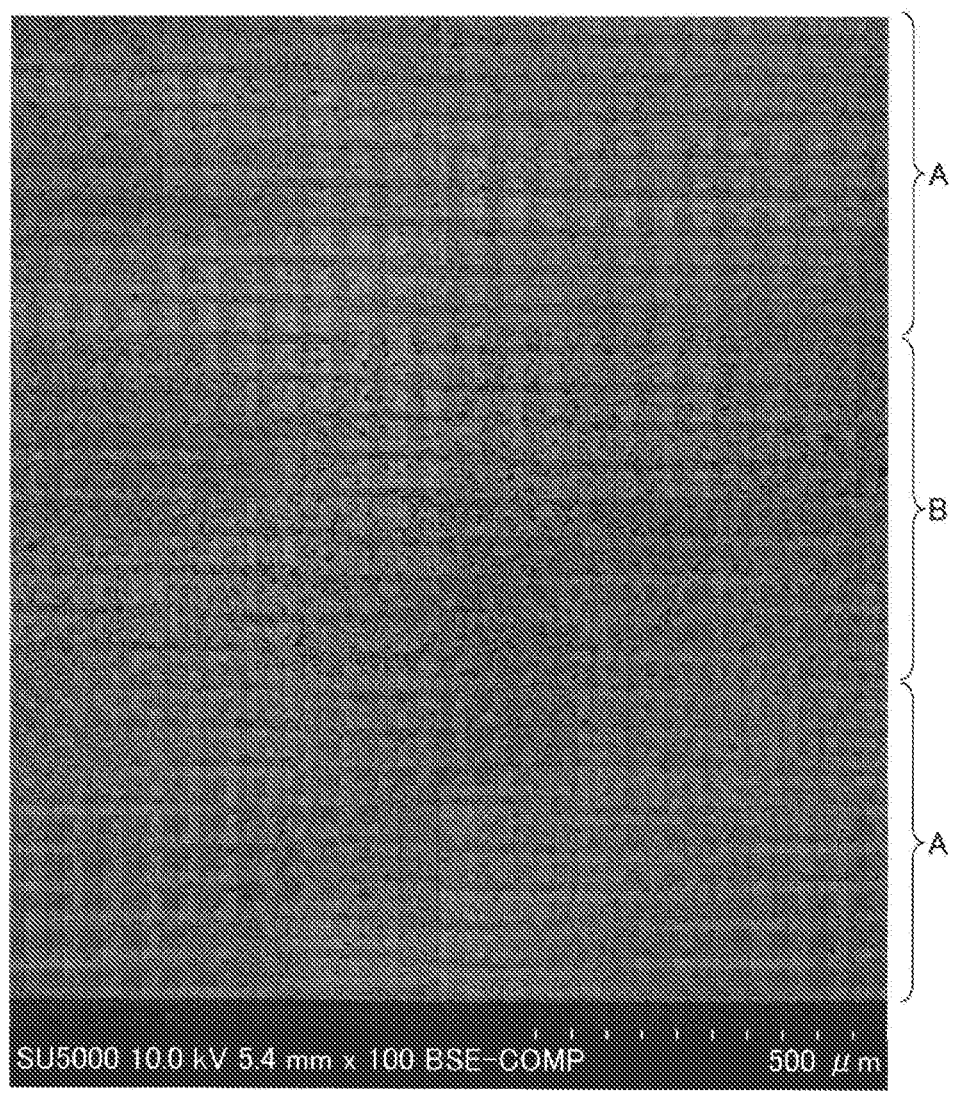
FIG. 6 is an example of a SEM image acquired in Example.
Figure 7A:
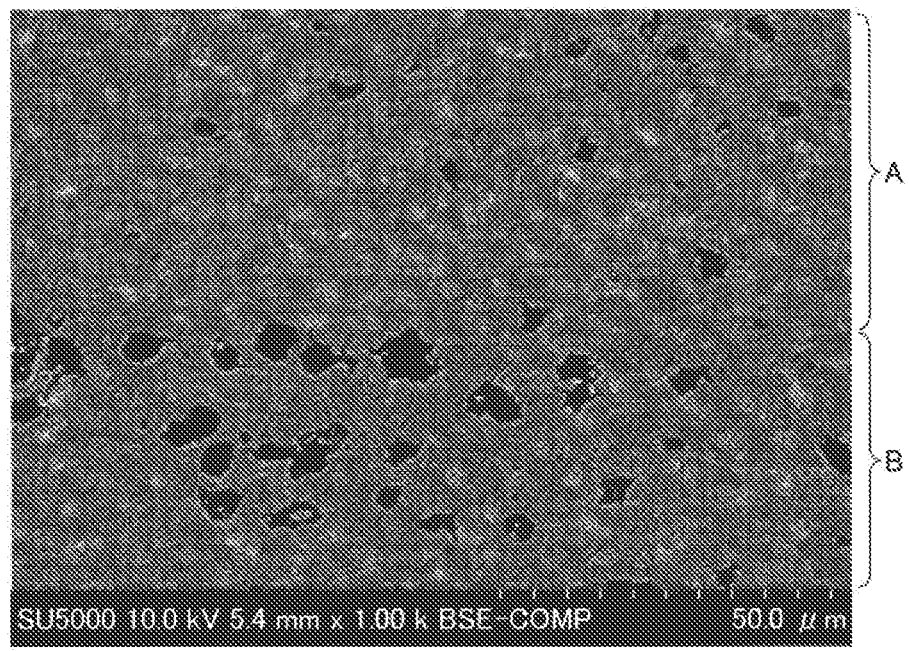
FIGS. 7A and 7B are enlarged views of FIG. 6.
Figure 7B:
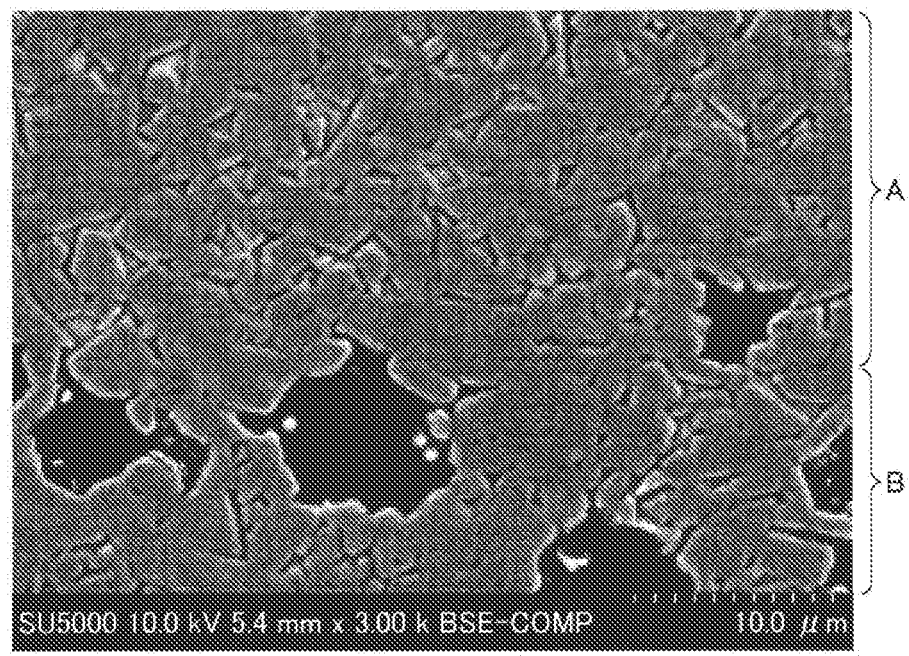

After degreased in a neutral atmosphere, the plate-shaped integrated body was subjected to a calcination treatment at about 1550° C. to obtain an integrated sintered body. After cutting this sintered body and polishing a cross-section thereof a microstructure was confirmed by SEM observation. The SEM images are shown in FIGS. 6 to 7B. In FIGS. 6 to 7B, 'A' indicates a layer derived from the first green sheet, and 'B' indicates a layer derived from the second green sheet. In the meantime, FIG. 7A is an enlarged view of the vicinity of an A/B interface in the SEM image of FIG. 6, and FIG. 7B is a further enlarged view of the vicinity of the A/B interface in the SEM image of FIG. 6.

As shown in FIGS. 6 to 7B, there is a clear difference in porosity between the layers derived from the first and second green sheets. It was confirmed that the pores are all closed pores and there is no crack or distortion due to stress at the interface of the respective layers.

Also, no difference was observed in structures such as sintered grains, grain boundaries and the like in upper and lower portions of the interface. The porosity in the layer derived from the second green sheet was about 15%, and the porosity in the layer derived from the first green sheet was about 4% or less.

In this example, the difference in porosity between the layers derived from the first green sheet and the second green sheet is about 10%. However, the porosity can be arbitrarily adjusted by an amount of the pore-forming agent added to the slurry.

Like this, it was confirmed that it is possible to form the layers in which the same material is used as a main component and the porosity is different.

Although the preferred embodiments and the like have been described, the present disclosure is not limited to the embodiments and the like and the embodiments and the like can be diversely modified and replaced without departing from the scope of the claims.

For example, the dielectric layer 311 may be formed of an organic material such as a resin, and the heat generating body 32 may be embedded therein.

Also, as the suction target of the substrate fixing device of the present disclosure, a glass substrate and the like used in a manufacturing process of a liquid crystal panel and the like may be exemplified, in addition to the wafer (a silicon wafer and the like).

What is claimed is:

1. An electrostatic chuck comprising:
   at least one conductor layer;
   an electrostatic electrode; and
   a base body in which the electrostatic electrode is embedded, the base body having a first dielectric layer on which the electrostatic electrode is mounted, the base body having a second dielectric layer stacked on the first dielectric layer with covering the electrostatic electrode,
   wherein the conductor layer is formed on a surface of the first dielectric layer opposite to a surface on which the electrostatic electrode is mounted,
   wherein the second dielectric layer has a first surface facing the first dielectric layer and a second surface opposite to the first surface, and the second surface is a placement surface on which a suction target is placed, and
   wherein a relative permittivity of the first dielectric layer is lower than a relative permittivity of the second dielectric layer.

2. The electrostatic chuck according to claim 1, wherein the first dielectric layer and the second dielectric layer are made of ceramic.

3. The electrostatic chuck according to claim 2, wherein the second dielectric layer has alumina as a main component, and
   wherein the first dielectric layer has any one of mullite, forsterite steatite and cordierite, as a main component.

4. The electrostatic chuck according to claim 2, wherein the first dielectric layer and the second dielectric layer have a same material, as a main component, and
   wherein a porosity of the first dielectric layer is greater than a porosity of the second dielectric layer.

5. The electrostatic chuck according to claim 4, wherein the second dielectric layer has alumina having a relative density of 92% or greater, as a main component, and
   wherein the first dielectric layer has alumina having a relative density of 50% or greater and less than 90%, as a main component.

6. The electrostatic chuck according to claim 1, wherein the conductor layer is an RF electrode.

7. A substrate fixing device comprising:
   a base plate; and
   the electrostatic chuck according to claim 1 mounted on one surface of the base plate.

* * * * *